(12) United States Patent
Adachi et al.

(10) Patent No.: US 10,004,166 B2
(45) Date of Patent: Jun. 19, 2018

(54) SHIELD MEMBER FOR CONDUCTING PATH AND WIRE HARNESS

(75) Inventors: Hideomi Adachi, Kosai (JP); Hidehiko Kuboshima, Kosai (JP)

(73) Assignee: YAZAKI CORPORATION, Tokyo (JP)

( * ) Notice: Subject to any disclaimer, the term of this patent is extended or adjusted under 35 U.S.C. 154(b) by 0 days. days.

(21) Appl. No.: 13/821,627

(22) PCT Filed: Sep. 16, 2011

(86) PCT No.: PCT/JP2011/071782
§ 371 (c)(1),
(2), (4) Date: Mar. 8, 2013

(87) PCT Pub. No.: WO2012/036320
PCT Pub. Date: Mar. 22, 2012

(65) Prior Publication Data
US 2013/0175079 A1 Jul. 11, 2013

(30) Foreign Application Priority Data
Sep. 16, 2010 (JP) ................................. 2010-207549

(51) Int. Cl.
*H05K 9/00* (2006.01)
*B60R 16/02* (2006.01)

(52) U.S. Cl.
CPC ........... *H05K 9/00* (2013.01); *B60R 16/0215* (2013.01); *H05K 9/0098* (2013.01)

(58) Field of Classification Search
CPC ...... H01B 7/0861; H01B 7/0838; H01B 7/06; H01B 7/065; H01B 11/1091;
(Continued)

(56) References Cited

U.S. PATENT DOCUMENTS

| 3,555,169 A | * | 1/1971 | Miller | .................... | H01B 11/00 |
| | | | | | 174/106 R |
| 3,557,301 A | * | 1/1971 | Gazzana | ................ | H01B 7/201 |
| | | | | | 174/102 D |

(Continued)

FOREIGN PATENT DOCUMENTS

| CN | 101529534 A | 9/2009 |
| DE | 198 56 605 A1 | 6/2000 |

(Continued)

OTHER PUBLICATIONS

International Search Report (PCT/ISA/210) dated Dec. 15, 2011, issued by the International Searching Authority in International Application No. PCT/JP2011/071782.

(Continued)

*Primary Examiner* — Hoa C Nguyen
*Assistant Examiner* — Christopher L Augustin
(74) *Attorney, Agent, or Firm* — Sughrue Mion, PLLC

(57) ABSTRACT

A shield member capable of preventing the break of a metallic foil due to the bend of the metallic foil and bringing the shielding capability is provided. The shield member includes a metallic foil formed in a tubular shape, to be provided for covering and surrounding one or more conducting paths. At least one of a wrinkled part and an axially-uneven part is formed in the metallic foil at least in correspondence with a bent position of the one or more conducting paths. At least one of the wrinkled part and the axially-uneven part is formed over one loop of the metallic foil.

8 Claims, 2 Drawing Sheets

(58) Field of Classification Search
CPC .... H01B 11/1033; H01B 11/10; H02G 3/083;
H02G 3/088; H02G 3/18; H02G 3/065;
H02G 3/22; H02G 3/0633; H02G 3/0431;
H02G 3/045; H02G 15/013; H02G 11/00;
H02G 11/006; B60R 16/0222; B60R
16/0207; F16L 5/08; H01R 13/5804;
H02K 5/225; H02K 5/132; G02B 6/4428;
G02B 6/4476; G02B 6/4471; D06F
75/28; H05K 7/1491
USPC ........ 174/651, 656–658, 662, 68.1–68.3, 69,
174/70 R, 71 R, 72 R, 72 A, 72 B, 72 C,
174/113 A, 36, 102 R, 108, 109
See application file for complete search history.

(56) References Cited

U.S. PATENT DOCUMENTS

| | | | | |
|---|---|---|---|---|
| 3,576,939 | A * | 5/1971 | Ziemek | H01B 7/2825 |
| | | | | 156/54 |
| 3,651,244 | A * | 3/1972 | Silver | H01B 9/022 |
| | | | | 156/54 |
| 4,340,771 | A * | 7/1982 | Watts | H01B 11/1016 |
| | | | | 174/106 D |
| 4,533,784 | A * | 8/1985 | Olyphant, Jr. | H01B 13/2613 |
| | | | | 174/102 D |
| 5,451,718 | A * | 9/1995 | Dixon | H01B 7/288 |
| | | | | 156/54 |
| 5,486,649 | A * | 1/1996 | Gareis | H01B 11/1091 |
| | | | | 174/10 |
| 5,660,899 | A * | 8/1997 | Rockney et al. | 428/34.7 |
| 6,039,329 | A * | 3/2000 | Burns et al. | 280/11.19 |
| 6,274,813 | B1 * | 8/2001 | Houte | B60R 16/0215 |
| | | | | 174/68.3 |
| 6,323,425 | B1 * | 11/2001 | Hegler et al. | 174/68.3 |
| 7,271,340 | B2 | 9/2007 | Buck et al. | |
| 8,177,582 | B2 * | 5/2012 | Amidon | H01R 9/05 |
| | | | | 174/68.1 |
| 8,561,296 | B2 * | 10/2013 | Oga et al. | 29/857 |
| 2002/0074152 | A1 * | 6/2002 | Rockney | H01R 4/72 |
| | | | | 174/76 |
| 2004/0099427 | A1 * | 5/2004 | Kihira | 174/35 C |
| 2005/0208798 | A1 | 9/2005 | Shimoda | |
| 2006/0144613 | A1 | 7/2006 | Buck et al. | |
| 2007/0089893 | A1 * | 4/2007 | Seki | H02G 3/0487 |
| | | | | 174/36 |
| 2007/0272430 | A1 * | 11/2007 | Tuffile | H01B 11/1008 |
| | | | | 174/102 R |
| 2010/0294533 | A1 | 11/2010 | Yagi et al. | |
| 2011/0011613 | A1 * | 1/2011 | Brown et al. | 174/68.3 |
| 2011/0042139 | A1 * | 2/2011 | Duquette | F16L 9/147 |
| | | | | 174/84 R |

FOREIGN PATENT DOCUMENTS

| | | |
|---|---|---|
| EP | 1 260 746 A2 | 11/2002 |
| EP | 1 589 801 A2 | 10/2005 |
| FR | 1 358 972 A | 4/1964 |
| GB | 2 249 673 A | 5/1992 |
| JP | 58-020425 | 7/1981 |
| JP | 57-115119 A | 7/1982 |
| JP | 63-056524 U | 4/1988 |
| JP | 7-302514 A | 11/1995 |
| JP | 11-353952 A | 12/1999 |
| JP | 2005-26557 A | 1/2005 |
| JP | 2006-236982 A | 9/2006 |
| JP | 2007-109494 A | 4/2007 |
| JP | 2007-311045 A | 11/2007 |
| JP | 2009-54363 A | 3/2009 |

OTHER PUBLICATIONS

Written Opinion (PCT/ISA/237) dated Dec. 15, 2011, issued by the International Searching Authority, in International Application No. PCT/JP2011/071782.

Office Action dated Jul. 29, 2014 by the Japanese Patent Office in counterpart Japanese Application No. 2010-207549.

Office Action dated Mar. 11, 2015, issued by the State Intellectual Property Office of the People's Republic of China in counterpart Chinese Application No. 201180044283.4.

Office Action dated Oct. 9, 2014, issued by the Japanese Intellectual Property Office in counterpart Japanese Application No. 2010-207549.

Office Action dated Oct. 15, 2014 issued by the State Intellectual Porperty Office of the People's Republic of China in counterpart Chinese Patent Application No. 201180044283.4.

Communication dated Aug. 25, 2015, issued by the Japanese Patent Office in counterpart Japanese Patent Application No. 2010-207549.

Communication dated Aug. 26, 2015, issued by the State Intellectual Property Office of the People's Republic of China in counterpart Chinese Patent Application No. 201180044283.4.

Office Action dated Dec. 7, 2015, issued by the Japanese Patent Office in counterpart Japanese Application No. 2010-207549.

* cited by examiner

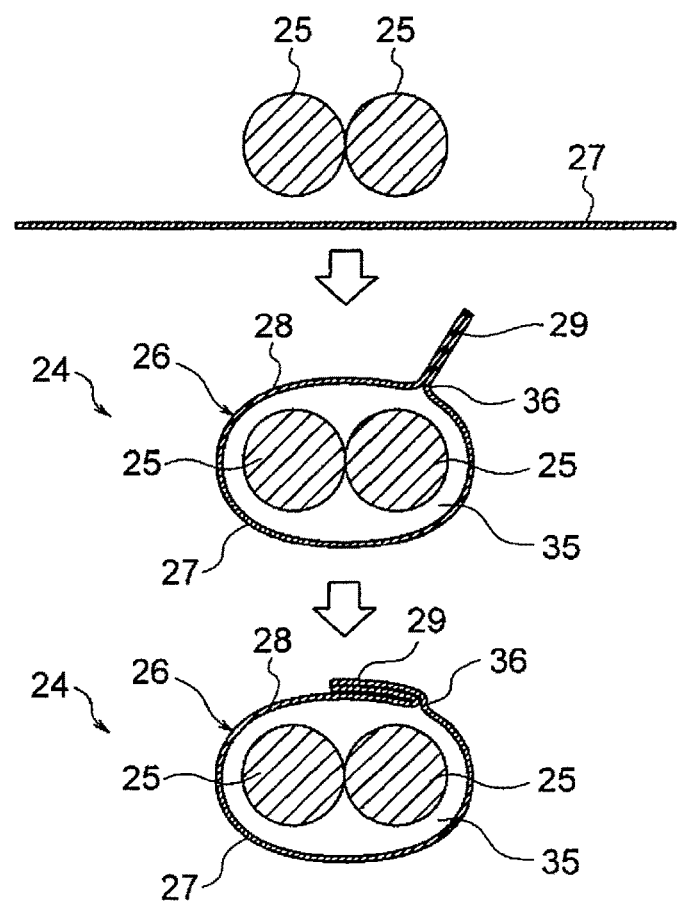
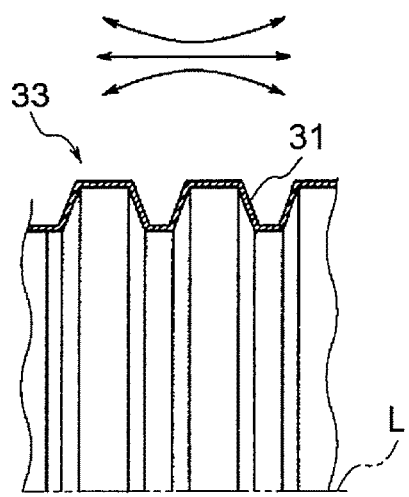
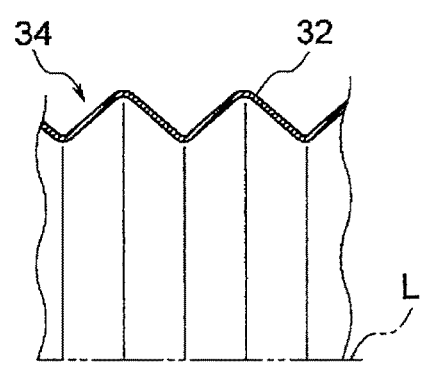

SHIELD MEMBER FOR CONDUCTING PATH AND WIRE HARNESS

TECHNICAL FIELD

The present invention relates to a shield member for conducting path which includes a tubular-shaped metallic foil covering one or more conducting paths, and relates to a wire harness.

BACKGROUND ART

In a wire harness being wired in a vehicle such as an automobile, it is usual. that an electric wire is covered by a shield member, for example, for a protection against noise from outside. The shield member is made of a braided wire, a metallic foil, or the like. A shield member made of the latter type of metallic foil is disclosed, for example, in Patent Literature 1.

CITATION LIST

Patent Literature

Patent Literature 1: JP-A-11-353952

SUMMARY OF INVENTION

Technical Problem

In the shield member which is made of the metallic foil, the expansibility is extremely low due to the metallic foil. Thus, when the wire harness is to be bent and wired, it may be difficult to produce extension of the metallic foil in correspondence with the bending of the wire harness according to circumstances. If the shield member is forcibly bent greatly, the metallic foil is likely to be broken. The problem is that it becomes difficult to realize the shielding capability of the shield member sufficiently if such a break of the metallic foil occurs.

The present invention has be achieved in view of the above circumstance, and an object of the invention is to provide a shield member for conducting path and a wire harness capable of preventing the break of a metallic foil due to the bend of the metallic foil and bringing the shielding capability sufficiently.

Solution to Problem

An aspect of the invention provides a shield member, including a metallic foil formed in a tubular shape, to be provided for covering and surrounding one or more conducting paths, wherein at least one of a wrinkled part and an axially-uneven part is formed in the metallic foil at least in correspondence with a bent position of the one or more conducting paths, the at least one of the wrinkled part and the axially-uneven part being formed over one loop of the metallic foil.

According to the above configuration, the metallic foil has at least one of the wrinkled part and the axially-uneven part. Thus, even if the shield member includes the tubular-shaped metallic foil, the shield member can have a stretch property changed between a state of stretching the wrinkles and a state of shrinking the wrinkles and/or a stretch property changed between a state of stretching the concavities and convexities and a state of shrinking the concavities and convexities. According to the above configuration, at least one of the wrinkled part and the axially-uneven part is formed over the one loop of the metallic foil. Thus, the shield member can have a stretch property irrespective of bending directions. Therefore, it is possible to prevent the break of the metallic foil even if it is bent. Note that if the range of forming the wrinkled part and/or the axially-uneven part is broadly set, the shield member can have a stretch property irrespective of bending positions.

The wrinkled part corresponds to a part of the metallic foil, in which wrinkles are willingly formed. The axially-uneven part corresponds to a part of the metallic foil, in which concavities and convexities are formed regularly or irregularly along the axial direction.

Another aspect of the invention provides a wire harness that covers and surrounds the one or more conducting paths by the shield member as defined above.

According to the above configuration, it is possible to provide the wire harness in which the break does not occur in the metallic foil of the shield member when the wire harness is bent and wired.

Advantageous Effects of Invention

According to the aspect of the invention, it is possible to prevent the break of the metallic foil even if it is bent. Furthermore, since the break of the metallic foil is prevented, the shielding capability of the shield member can be maintained sufficiently.

In addition, it is possible to provide the wire harness having better capabilities and properties.

BRIEF DESCRIPTION OF DRAWINGS

FIG. 2A is a diagram for showing superposition part to be processed.

FIG. 2B is a diagram for showing an axially-uneven part.

FIG. 2C is a diagram for showing a modification of the uneven part in FIG. 2B.

DESCRIPTION OF EMBODIMENTS

A shield member for conducting path includes a tube-shaped metallic foil which covers one or more conducting paths. A wrinkled part and/or an axially-uneven part are formed in the metallic foil. The wrinkled part and/or the axially-uneven part are arranged so as to correspond at least to bending positions of the conducting path. A wire harness is configured by covering the one or more conducting paths by the shield member for conducting path.

(Embodiment)

Figure 1A:
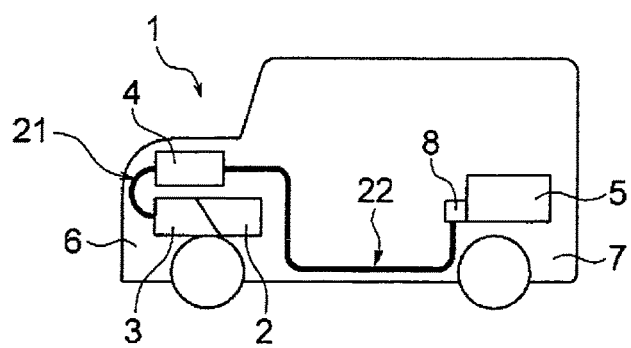
FIG. 1A is a schematic view of a vehicle in which a wire harness according to an embodiment of the invention is incorporated.
Figure 1B:
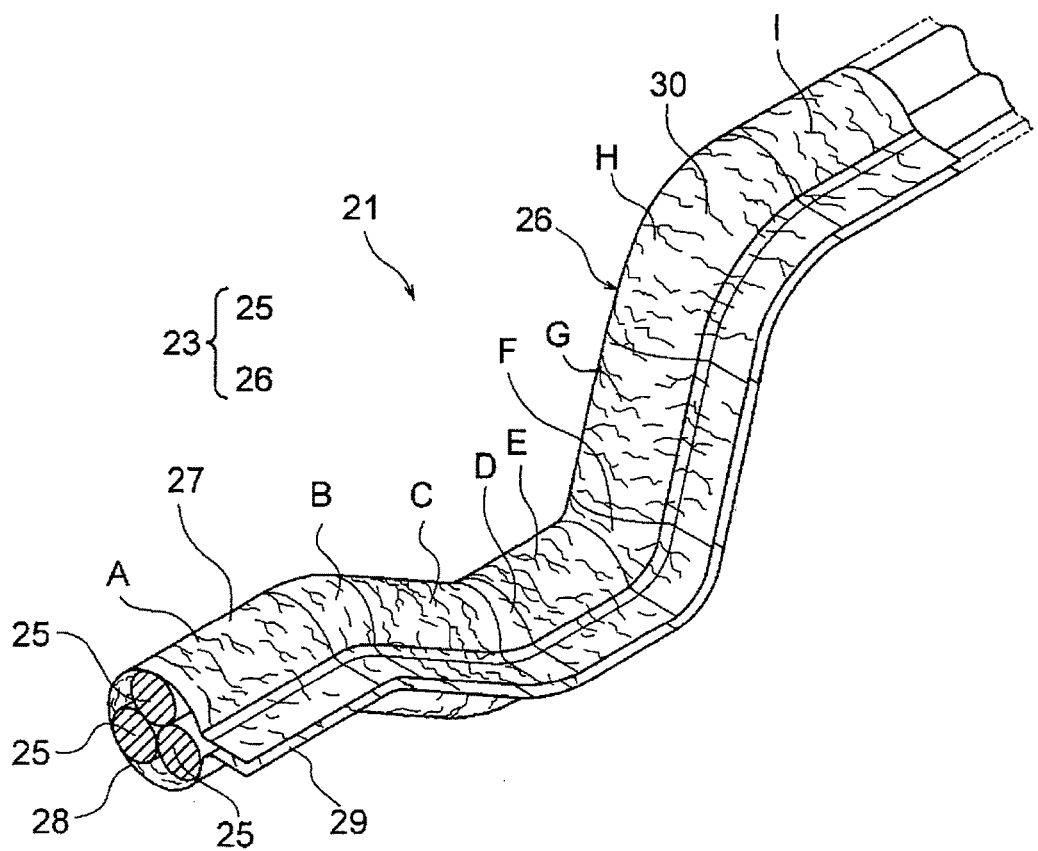
FIG. 1B is a configuration diagram of a harness body.

An embodiment of the invention will be explained with reference to drawings. FIG. 1A is a schematic view of a vehicle in which a wire harness according to the embodiment of the invention is incorporated. FIG. 1B is a configuration diagram of a harness body. FIG. 2A is a diagram for showing superposition part to be processed. FIG. 2B is a diagram for showing an axially-uneven part. FIG. 2C is a diagram for showing a modification of the uneven part in FIG. 2B.

The wire harness according to the embodiment is directed, for example, to one wired in a hybrid vehicle, or an electric vehicle. Hereinafter, the description is made with an example of the hybrid vehicle. The configuration, structure, and the effect of the wire harness are basically the same in a case of the electric vehicle. Further, the application of the wire harness according to the embodiment is not limited to the hybrid vehicle or the electric vehicle, and it can be also applied to a normal vehicle, etc.

FIG. 1 shows a hybrid vehicle 1. The hybrid vehicle 1 is a type of vehicle which is driven by mixing two kinds of power generated by an engine 2 and a motor unit 3. The motor unit 3 is supplied a power from a battery 5 (a battery pack) through an inverter unit 4. In the embodiment, the engine 2, the motor unit 3 and the inverter unit 4 are mounted in an engine room 6 at a front position of the hybrid vehicle 1 where front wheels exist. The battery 5 is mounted at a rear part 7 of the hybrid vehicle 1 where rear wheels exist. Alternatively, the battery 5 may be mounted in an interior space of the vehicle in the rear of the engine room 6.

The motor unit 3 is connected to the inverter unit 4 by a high-voltage wire harness 21 according to the embodiment. The battery 5 is also connected to the inverter unit 4 by a high-voltage wire harness 22 according to the embodiment. The wire harness 22 is wired through an underfloor space located at a ground side of a floor panel of the vehicle, or through an overfloor space located at the interior space side of the vehicle.

The embodiment of the invention is applied to each of the wire harnesses 21, 22. There is no problem to apply the embodiment of the invention only to the wire harness 21, or only to the wire harness 22.

A supplementary explanation of the embodiment will be given. The motor unit 3 includes a motor and a generator. The inverter unit 4 includes an inverter and a converter. The motor unit 3 is formed as a motor assembly which includes a shielding case. The inverter unit is also formed as an inverter assembly which includes a shielding case. The battery 5 is a type of Ni-MH (Nickel metal hydride) or Li-ion (Lithium-ion), and is modularized. A secondary battery device such as a capacitor can be utilized as the battery 5. The type of the battery 5 is not limited if it can be utilized in the hybrid vehicle 1 or the electric vehicle. In this embodiment, the wire harness 21 is connected to the battery 5 via a junction block 8.

The wire harness 21 connecting the motor unit 3 and the inverter unit 4 includes a wire harness body 23, connection parts (not shown in figure) respectively provided at both ends of the wire harness body 23, and an exterior member (not shown in figure) which covers the wire harness body 23. The configuration of the exterior member is arbitrary.

On the other hand, the wire harness 22 connecting the battery 5 and the inverter unit 4 includes a wire harness body 24 (refer to FIG. 2A), connection parts (not shown in figure) respectively provided at both ends of the wire harness body 24, and an exterior member (not shown in figure) which covers the wire harness body 24.

The wire harness body 24 (refer to FIG. 2A) of the wire harness 22 in the embodiment has the configuration basically same as the wire harness body 23 of the wire harness 21. The difference is the number of high-voltage electric wires 25 described later (one includes three wires, and the other includes two). The connection parts (not shown in figure) of the wire harness 22 has the configuration basically same as the connection parts (not shown in figure) of the wire harness 21.

As mentioned above, the wire harness bodies 23, 24 have the same configuration basically. Thus, an explanation is given while taking the wire harness body 23 of the wire harness 21 as an example of the configuration and the structure, and taking the wire harness body 24 of the wire harness 22 as an example of the manufacture.

The wire harness body 23 includes three high-voltage electric wires 25 (conducting paths), a shield member 26 (a shield member for conducting path) which accommodates the three high-voltage electric wires 25 in a bundle. The wire harness body 23 is characterized by the shield member 26, and the shield member 26 has a stretch property capable of bending in every direction.

The high-voltage electric wire 25 corresponds to a conducting path which includes a conductor and an insulator (a cover). The high-voltage electric wire 25 has a length required for establishing electrical connection. In the embodiment, the conductor is made of copper, copper alloy, aluminum, or the like. The conductor may be formed by a structure of conductor in which strands are twisted, or a structure of rod-shaped conductor having a rectangular cross section or a circular cross section. For example, a structure of conductor formed by a rectangular single core or a circular single core is considered. In this case, the electric wire itself has a rod-shape. The high-voltage electric wire 25 has structure of non-shield member. In the embodiment, the high-voltage electric wire 25 is used, but the invention is not limited thereto. That is, a bus bar can be used as conducting path. Further, a bundle of low-voltage electric wires can be used as conducting path in the case of normal vehicle or the like.

The shield member 26 is formed of a metallic foil 27 alone, or a sheet in which the metallic foil 27 and thin base material joint in laminated structure. The shield member 26 is wound with respect to the three high-voltage electric wires 25, and formed in a tubular-shape to surround the three high-voltage electric wires 25 in a bundle. The entire length of the shield member 26 is set in correspondence with a range to which the electromagnetic shield capability is brought.

As the material of the metallic foil 27, a material having a conductivity and a predetermined thickness, such as copper, copper alloy, aluminum, aluminum alloy, or iron. The metallic foil 27 is provided as a part for bringing the electromagnetic shield capability. The metallic foil 27 is connected to each shield case of the motor unit 3 and the inverter unit 4 through the connection part not shown (connected to the junction block 8 in the case of the wire harness 22), thereby establishing a frame-ground connection.

The shield member 26 is formed, for example, in a "baggy" tube with respect to the three high-voltage electric wires 25, so as to create an enough clearance between the shield member 26 and the three high-voltage electric wires 25. The shield member 26 forms a closed circuit in a circumferential direction by forming a tubular part 28 and a superposition part 29 on the metallic film 27.

In the embodiment, the superposition part 29 is fixed by connecting both sides of the metallic foil 27 by adhesive or double-faced tape having conductivity. The projection length of the superposition part 29 is arbitrarily set in consideration with the cost and the capability. It is preferable that the superposition part 29 is formed so as not to create an opening at the superposition of the metallic foil 27, for example, when the wire harness body 23 is bent.

The shield member 26 includes a wrinkled part 30 formed over one loop of the metallic foil 27. The wrinkled part 30 is formed in a wrinkled shape in which the metallic foil 27 has numerous stretchable wrinkles, in other words, formed in a shape in which the metallic foil 27 is crumpled up. To give a specific example, the wrinkled part 30 is formed into such a shape in which an aluminum foil usually used in a home is balled up once, and then, the balled-up aluminum foil is restored in a sheet-shape to the extent that the wrinkles are not entirely stretched.

The wrinkled part 30 has properties of absorption of dimension change and prevention of break by stretching and shrinking the wrinkles. The wrinkled part 30 is not formed by an aggregation of wrinkles aligned regularly, but formed by an aggregation of wrinkles scattered irregularly. According to this structure, it is possible to accommodate a twisting as well as stretching and shrinking, and bending.

As well as forming the wrinkled part 30 all over the metallic foil 27 as described in this embodiment, it may be formed in correspondence with a bent position of the high-voltage electric wires 25. Among reference signs A to I in FIG. 1A, each of the reference signs B, D, F and H indicates the bent position, and the wrinkled part 30 may be formed in these areas. If the wrinkled part is formed entirely, general versatility can be given.

As a shape having a similar capability to the wrinkled part 30, examples of an axially-uneven part 31 as shown in FIG. 2B and an axially-uneven part 32 as shown in FIG. 2C are given. The axially-uneven parts 31, 32 are formed in shapes in which concavities and convexities are alternately continued with regularity along an axial direction L of the shield members 33, 34. Alternatively, the axially-uneven parts 31, 32 may be formed in shapes in which concavities and convexities are continued alternately and randomly along the axial direction L of the shield members 33, 34. The axially-uneven parts 31, 32 are formed over one loop of the metallic foil 27. Both the axially-uneven parts 31, 32 and the wrinkled part 30 may be mixedly formed.

The exterior member protects the wire harness body 23 of the wire harness 21 or the wire harness body 24 of the wire harness 24. In the latter case as the exterior member, for example, a known corrugated tube, pipe member or a protector may be adopted.

Next, a manufacturing method of the wire harness body 24 will be explained on the basis of the configuration and the structure mentioned above.

In FIG. 2A, the first step is preparing the high-voltage electric wires 25 and the metallic foil 27 (or the sheet in which the metallic foil 27 and the thin base material joint in laminated structure) in which the wrinkled part 30 (refer to FIG. 1B) is previously formed.

In FIG. 2A, the second step is rounding and winding the metallic foil 27 with respect to the high-voltage electric wires 25, thereby forming the tubular part 28 and the superposition part 29. At this time, the tubular part 28 is formed so as to create an enough clearance 35 with respect to the two high-voltage electric wires 25. The superposition part 29 is formed so as to electrically connect the both ends of the metallic foil 27.

In FIG. 2A, the third step is the superposition part 29 is brought down to one side so as to fold and bend a base end 36 of the superposition part 29, and then, causing the brought-down superposition part 29 to be extended along the surface of the tubular part 28. It is preferable to fix the superposition part 29, for example, with tape at arbitrary positions in order to hold the superposition part 29 extended along the surface of the tubular part 28.

As explained above with reference to FIGS. 1A through 2C, according to the embodiment of the invention, the metallic foil 27 has at least one of the wrinkled part 30 and the axially-uneven parts 31, 32. Thus, even if the shield member 26 includes the tubular-shaped metallic foil 27, the shield member 26 can have a stretch property changed between a state of stretching the wrinkles and a state of shrinking the wrinkles and/or a stretch property changed between a state of stretching the concavities and convexities and a state of shrinking the concavities and convexities (refer to an arrow in FIG. 2B as to "stretch property").

According to the embodiment of the invention, at least one of the wrinkled part 30 and the axially-uneven parts 31, 32 is formed over the one loop of the metallic foil 27. Thus, the shield member 26 can have a stretch property irrespective of bending directions.

According to the embodiment of the invention, therefore, it is possible to prevent the break of the metallic foil 27 even if it is bent. Furthermore, since the break of the metallic foil 27 is prevented, the shielding capability of the shield member 26 can be maintained sufficiently.

In addition, it is possible to provide the wire harnesses 21, 22 having better capabilities and properties.

The present invention can be implemented by various modifications without departing from the essence of the present invention.

This application is based upon and claims the benefit of priority of Japanese Patent Application No. 2010-207549 filed on Sep. 16, 2010, the contents of which are incorporated herein by reference in its entirety.

INDUSTRIAL APPLICABILITY

The shield member and the wire harness according to an aspect of the invention are useful in a case where they are mounted in a vehicle which is required to wire and bend electric wires, such as a hybrid vehicle, an electric vehicle, or a normal vehicle.

The invention claimed is:

1. A shield member, comprising:
   a metallic foil formed in a tubular shape, to be provided for covering and surrounding one or more conducting paths,
   wherein an axially-uneven part is formed in the metallic foil at least in correspondence with a bent position of the one or more conducting paths, the axially-uneven part being formed over one loop of the metallic foil, the axially-uneven part having a bent portion and a non-bent portion,
   wherein the axially-uneven part is formed in the metallic foil so that concavities and convexities are alternately continued along an axial direction of the shield member, but extend continuously in a circumferential direction of the shield member, and bottoms of the concavities and tops of the convexities have respective heights kept in constant in the circumferential direction,
   wherein opposing sides of each convexity are mirror images along the circumferential direction center line of each convexity,
   wherein inner surfaces of both sides of the metallic foil in the circumferential direction contact and superposes each other, and
   wherein the non-bent portion and the bent portion of the axially-uneven part include a wrinkled part which is formed over a peripheral of the metallic foil, and the wrinkled part has a wrinkled shape in which the metallic foil has numerous stretchable wrinkles.

2. The shield member according to claim 1, wherein the axially-uneven part is formed all over the metallic foil.

3. The shield member according to claim 1, wherein
   The wrinkles are formed so that the concavities and convexities are continued alternately and randomly along the axial direction of the shield member.

4. A wire harness that covers and surrounds the one or more conducting paths by the shield member as defined in claim 1.

5. The shield member according to claim 1, wherein the axially-uneven part is configured to stretch and shrink in a length direction of the one or more conducting path and to allow the shield member to be twisted and bent with respect to the length direction.

6. A shield member, comprising:
- a metallic foil formed in a tubular shape having an axial length, to be provided for covering and surrounding one or more conducting paths, wherein:
- an axially-uneven part is formed in the metallic foil over an entirety of the axial length of the metallic foil, at least in correspondence with a bent position of the one or more conducting paths, the axially-uneven part being formed over one loop of the metallic foil,
- the axially-uneven part is formed in the metallic foil so that concavities and convexities are alternately continued along an axial direction of the shield member, but extend continuously in a circumferential direction of the shield member, and bottoms of the concavities and tops of the convexities have respective heights kept in constant in the circumferential direction,
- an angle between walls of the convexity and the bottoms of the concavity on each side of the convexity is equal,
- inner surfaces of both sides of the metallic foil in the circumferential direction contact and superposes each other, and
- wherein the axially-uneven part includes a wrinkled part over the entirety of the axial length of the metallic foil, which is formed over a peripheral of the metallic foil, and the wrinkled part is formed in a wrinkled shape in which the metallic foil has numerous stretchable wrinkles over entirety of the axial length of the metallic foil.

7. The shield member according to claim 1, wherein opposing sides of the axially-uneven part with respect to the axial direction of the shield member are mirror images.

8. The shield member according to claim 6, wherein opposing sides of the axially-uneven part with respect to the axial direction of the shield member are mirror images.

* * * * *